(12) United States Patent
Lau et al.

(10) Patent No.: US 11,596,052 B2
(45) Date of Patent: Feb. 28, 2023

(54) INTEGRATED VOLTAGE REGULATOR FOR HIGH PERFORMANCE DEVICES

(71) Applicant: Intel Corporation, Santa Clara, CA (US)

(72) Inventors: Wei Cheang Lau, Nibong Tebal Pulau Pinang (MY); Yew San Lim, Gelugor Pulau Pinang (MY); Min Suet Lim, Gelugor Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/988,756

(22) Filed: Aug. 10, 2020

(65) Prior Publication Data
US 2021/0385938 A1 Dec. 9, 2021

(30) Foreign Application Priority Data
Jun. 8, 2020 (MY) .............................. PI2020002910

(51) Int. Cl.
| | |
|---|---|
| *H05K 1/02* | (2006.01) |
| *H05K 1/18* | (2006.01) |
| *H05K 1/14* | (2006.01) |
| *H05K 7/20* | (2006.01) |
| *H01L 23/36* | (2006.01) |

(52) U.S. Cl.
CPC ............ *H05K 1/0203* (2013.01); *H05K 1/14* (2013.01); *H05K 1/181* (2013.01); *H05K 7/20836* (2013.01); *H01L 23/36* (2013.01); *H05K 2201/066* (2013.01); *H05K 2201/10409* (2013.01)

(58) Field of Classification Search
CPC ...... H02M 3/1582; H05K 2201/10416; H05K 2201/09072; H05K 1/183; H05K 1/184; H05K 1/0203; H05K 1/021; H05K 1/0212; H05K 3/4697; H05K 7/209; H05K 2201/09036; H05K 2201/09472; H05K 2201/09745; H05K 1/14; H05K 1/181; H05K 7/20836; H05K 2201/066; H05K 2201/10409; H01L 23/4012; H01L 2023/405; H01L 2023/4062; H01L 2023/4068; H01L 2225/06589; H01L 23/36

See application file for complete search history.

(56) References Cited

U.S. PATENT DOCUMENTS

| | | | | |
|---|---|---|---|---|
| 5,873,751 A | * | 2/1999 | Daly ..................... | H05K 1/119 439/620.24 |
| 6,212,086 B1 | * | 4/2001 | Dinh ..................... | H05K 1/181 363/144 |

(Continued)

*Primary Examiner* — Michael A Matey
(74) *Attorney, Agent, or Firm* — Viering, Jentschura & Partner mbB

(57) ABSTRACT

The present disclosure generally relates to a computer circuit board having an integrated voltage regulator assembly that may include a heat sink and at least one voltage regulator module board. The heat sink may have a metal plate with at least one recess in which the voltage regulator module board may be attached. The voltage regulator module board is electrically coupled to a semiconductor package and the heat sink is thermally coupled to the semiconductor package. The computer circuit board is used in high-performance computing devices including computer workstations and computer servers.

15 Claims, 7 Drawing Sheets

(56) References Cited

U.S. PATENT DOCUMENTS

| | | | | |
|---|---|---|---|---|
| 6,281,573 | B1* | 8/2001 | Atwood | H01L 23/3675 |
| | | | | 165/80.3 |
| 6,356,448 | B1* | 3/2002 | DiBene, II | H01R 12/52 |
| | | | | 361/721 |
| 6,847,529 | B2* | 1/2005 | Dibene, II | H05K 7/1092 |
| | | | | 257/E23.09 |
| 9,070,642 | B2 | 6/2015 | Standing | H01L 25/16 |
| 9,543,226 | B1* | 1/2017 | Nuttall | H01L 23/373 |
| 10,624,240 | B2* | 4/2020 | Leigh | G02B 6/4269 |
| 2002/0151195 | A1* | 10/2002 | DiBene, II | G06F 1/189 |
| | | | | 257/E23.09 |
| 2002/0172022 | A1* | 11/2002 | DiBene, II | H01R 12/7088 |
| | | | | 257/E23.09 |
| 2002/0176229 | A1* | 11/2002 | Derian | H01R 12/52 |
| | | | | 257/E23.09 |
| 2002/0196614 | A1* | 12/2002 | DiBene, II | H05K 3/368 |
| | | | | 361/803 |
| 2003/0169575 | A1* | 9/2003 | Ikuta | H01L 23/5389 |
| | | | | 361/761 |
| 2004/0027802 | A1* | 2/2004 | Duerbaum | H05K 1/141 |
| | | | | 361/688 |
| 2005/0135065 | A1* | 6/2005 | Nakatsu | H01L 23/4006 |
| | | | | 361/703 |
| 2005/0212120 | A1* | 9/2005 | Tran | H01L 23/50 |
| | | | | 257/712 |
| 2005/0276029 | A1* | 12/2005 | Lober | H01R 13/2442 |
| | | | | 361/769 |
| 2006/0044762 | A1* | 3/2006 | Kikuchi | H01L 25/165 |
| | | | | 361/704 |
| 2006/0099734 | A1* | 5/2006 | Narendra | G06F 1/26 |
| | | | | 438/107 |
| 2006/0285297 | A1* | 12/2006 | Conner | H01L 23/4006 |
| | | | | 361/710 |
| 2008/0155990 | A1* | 7/2008 | Gupta | H05K 7/1092 |
| | | | | 62/3.2 |
| 2009/0194869 | A1* | 8/2009 | Eom | H01L 23/3675 |
| | | | | 257/712 |
| 2012/0127666 | A1* | 5/2012 | Park | H05K 1/053 |
| | | | | 361/709 |
| 2014/0239413 | A1* | 8/2014 | Stella | H01L 23/49575 |
| | | | | 257/401 |
| 2015/0160701 | A1* | 6/2015 | Bruno | H01L 23/367 |
| | | | | 361/679.31 |
| 2015/0245503 | A1* | 8/2015 | Hansen | H01R 13/04 |
| | | | | 174/59 |
| 2018/0308776 | A1* | 10/2018 | Morimoto | H01L 23/12 |
| 2019/0123094 | A1* | 4/2019 | Foster | H01L 27/156 |
| 2019/0393165 | A1* | 12/2019 | Radhakrishnan | H01L 23/645 |
| 2020/0053907 | A1* | 2/2020 | Moser | H05K 7/1432 |
| 2020/0245464 | A1* | 7/2020 | Hattori | H01L 23/4093 |
| 2020/0305285 | A1* | 9/2020 | Xiong | H05K 1/181 |
| 2020/0381351 | A1* | 12/2020 | Calugaru | H01L 23/50 |
| 2021/0321527 | A1* | 10/2021 | Ma | H05K 1/0206 |

* cited by examiner

INTEGRATED VOLTAGE REGULATOR FOR HIGH PERFORMANCE DEVICES

CROSS-REFERENCE TO RELATED APPLICATIONS

This application claims priority to Malaysian Patent Application No. PI2020002910, which was filed on Jun. 8, 2020, the entire contents of which are hereby fully incorporated herein by reference.

BACKGROUND

With continued miniaturization, the optimized placement of the various modules supporting a central processing unit (CPU) package or a system-on-chip (SOC) package is important for providing efficient and improved performance. For high-end performance desktops and workstations, there are challenges in meeting the desired load line and short loop inductance to deliver high current/power to their CPU packages.

A voltage regulator (VR) is used to regulate voltage levels to provide a steady, fixed output voltage that remains constant for any changes in an input voltage or load conditions. The VR acts as a direct current (DC)-to-DC power converter which steps down voltage (while stepping up current) from its input (supply) to its output (load). It also acts as a buffer for protecting components from damage. There numerous types of regulators (e.g., linear, switching, etc.), and switching VRs are widely used for semiconductor applications. The VRs are typically "buck converters."

A switching VR rapidly switches a series device on and off. The switch's duty cycle sets the amount of charge transferred to the load. Switching regulators are efficient because the series element is either fully conducting or switched off and it dissipates almost no power. An advantage of using a switching VR as a power supply is the capability to work at higher power efficiency.

The VRs may have relatively complex designs that require significant space for their various sub-components, including a heat sink. Most high-end motherboards have an elongated heat sink near the CPU socket. The heat sink is for cooling the Voltage regulator module section, or to be more specific, to cool the MOSFETs and inductors, which can get very hot; for example, peak temperatures can range from 80° C. to 100° C., and in cases of high-end graphic cards, temperatures can be even more extreme at up to 120° C.

In considering design layouts, when the voltage regulator modules are positioned further from the CPU or SOC package, it may result in a higher loop inductance, which requires more decoupling capacitors, a higher loop resistance, which may cause power delivery to be less efficient, and a higher current draw from the nearest voltage regulator modules, which may damage the voltage regulator modules due to overclocking.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to an assembly that may include a heat sink component and at least one voltage regulator module board (VRMB). The heat sink component may have a metal plate with at least one recess in which a VRMB may be attached.

In the various aspects, the bottom side portions of a heat sink may not be fully utilized for thermal spreading and one or more VRMB may be embedded into the heat sink providing shorter traces to deliver the required power to a SOC or CPU. It should be understood that SOC and CPU are used interchangeably according to the present disclosure. The voltage regulator modules may be shifted from a printed circuit board (PCB) to the heat sink, which may be mounted directly on a SOC substrate and thereby may reduce the loop inductance and improve the power performance. The VRMB may have a connector with input/output pads for coupling with a SOC substrate when the integrated voltage regulator assembly is mounted onto the substrate supporting the SOC.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

Figure 1A:
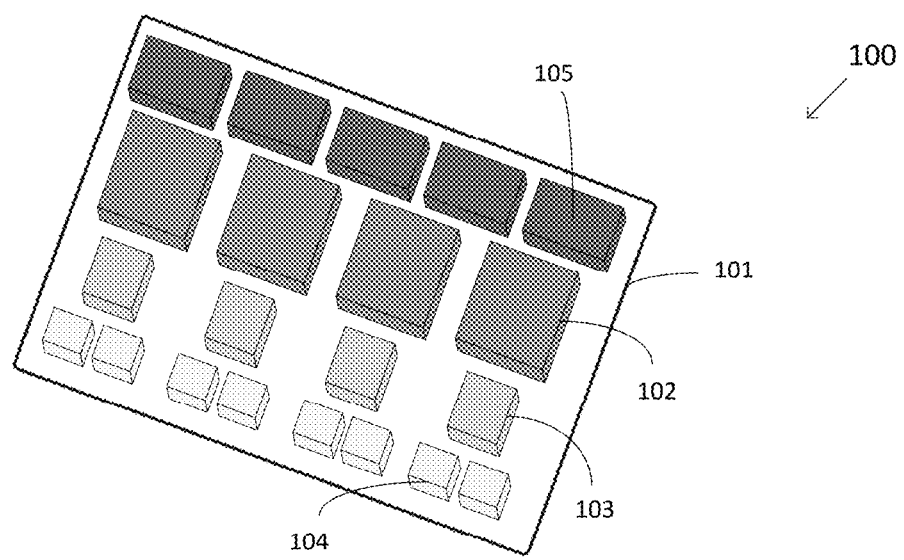
FIG. 1A shows a top view layout of a voltage regulator module board (VRMB) according to an aspect of the present disclosure.

In the aspect shown in FIG. 1A, a top view layout of a VRMB 100 according to the present disclosure. The VRMB 100 may have a voltage regulator board (VR board) or sub-board 101 with four voltage regulator modules or phases, in which some of the standard components for such modules being inductors 102, DrMOSFETs 103, input capacitors 104, and output capacitors 105. It should be understood that VRMB 100 may have additional standard components, such as a VR controller (not shown), to provide the intended functionality according to the present disclosure. It should also be understood that modules and phases are used interchangeably according to the present disclosure. While the VR board 101 is shown in the figures as having a rectangular shape, it should be understood that other suitable shapes may be used to facilitate their attachment to a heat sink and/or may be standardized for convenient manufacturing.

In an aspect, the DrMOSFET 103 may be used for synchronous rectification, the input capacitors act as supply-side filters, and in combination with inductors 102 may be used as an energy storage element, and the out capacitors 105 acts as load-side filters (sometimes in combination with inductors) to reduce voltage ripples. A DrMOSFET is an acronym for Driver and MOSFET module, which is a high-efficiency synchronous buck power module consisting of two asymmetrical MOSFETs and an integrated driver. In another aspect, a DrGAN may be used in place of a DrMOSFET. A DrGAN is an acronym for Driver and Galium Nitride module According to the present disclosure, the VR board 101, which supports and couples these aforementioned components, may have traces, planes (e.g., reference planes, ground planes) and a variety of vias (e.g., through vias, blind vias, embedded vias).

Figure 1B:
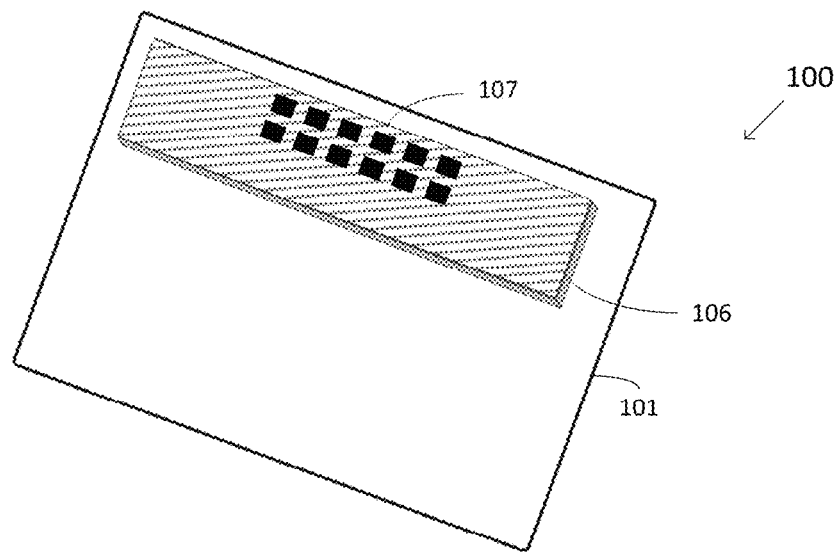
FIG. 1B shows a top view layout of a VRMB with a connector according to the aspect of the present disclosure.

In FIG. 1B, a reverse-side top view of the VRMB 100 is shown according to an aspect of the present disclosure. The VR board 101 may have a connector 106 with contact pads 107 positioned thereon. The connector 106 is shown in FIG. 1A as having a rectangular shape, but other shapes may be used as needed to correspondingly align the contact pads 107. While the VR board 101 is shown in the figures as having a rectangular shape, it should be understood that other suitable shapes may be used to facilitate a VR board's attachment to a heat sink.

Figure 2:
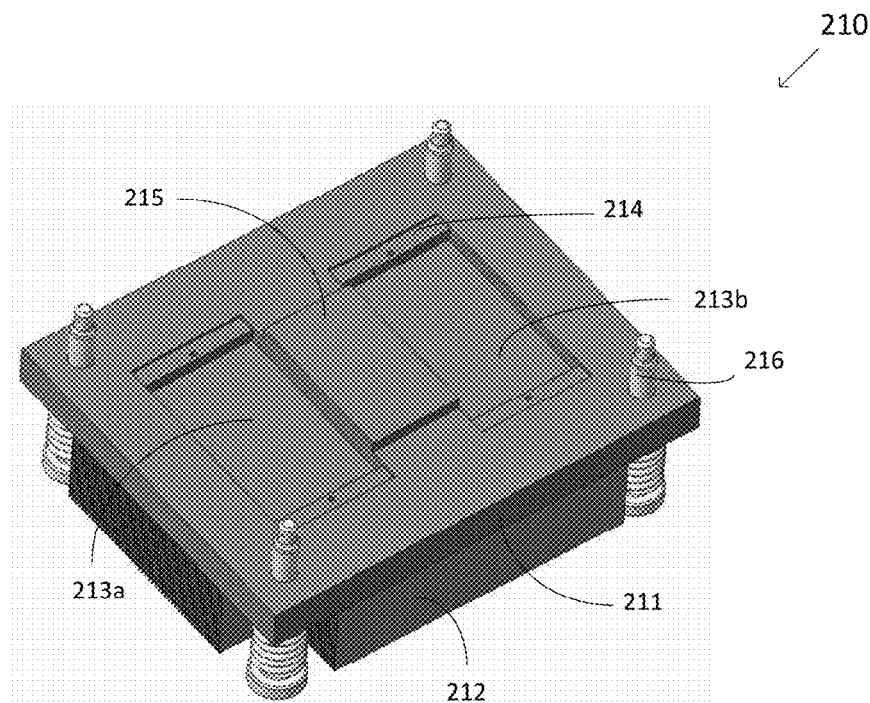
FIG. 2 shows a perspective top view layout of a heat sink with a metal plate having recesses according to an aspect of the present disclosure.

FIG. 2 shows a perspective top view layout of a heat sink 210 with a metal plate 211 having recesses 213a and 213b according to an aspect of the present disclosure. In the aspect shown in FIG. 2, the heat sink 211 may include a heat spreader 212 and four mounting pins 216. The heat spreader 212 may be a solid block or a plurality of thin fins made of a heat conductor material, e.g., aluminum or copper. In an aspect, the metal plate 211 may have raised section 215 that is positioned between the recesses 213a and 213b.

According to the present disclosure, a raised section 215 of the heat sink 210 may be located approximately at the center of the metal plate 211, while the recesses 213a and 213b are formed off-center in the metal plate of the heat sink. The function of the raised section 215 is to be a thermally conductive pathway for an attached semiconductor device. In addition, the recesses 213a and 213b may have step portions 214 for attaching a VR board. While the recesses 213a and 213b are shown in the figures as having a rectangular shape, it should be understood that their shapes will correspond with a VR board's shape to facilitate the VR board's attachment to a heat sink. The recesses and the raised section may be formed by conventional metal work and machining methods.

Figure 3:
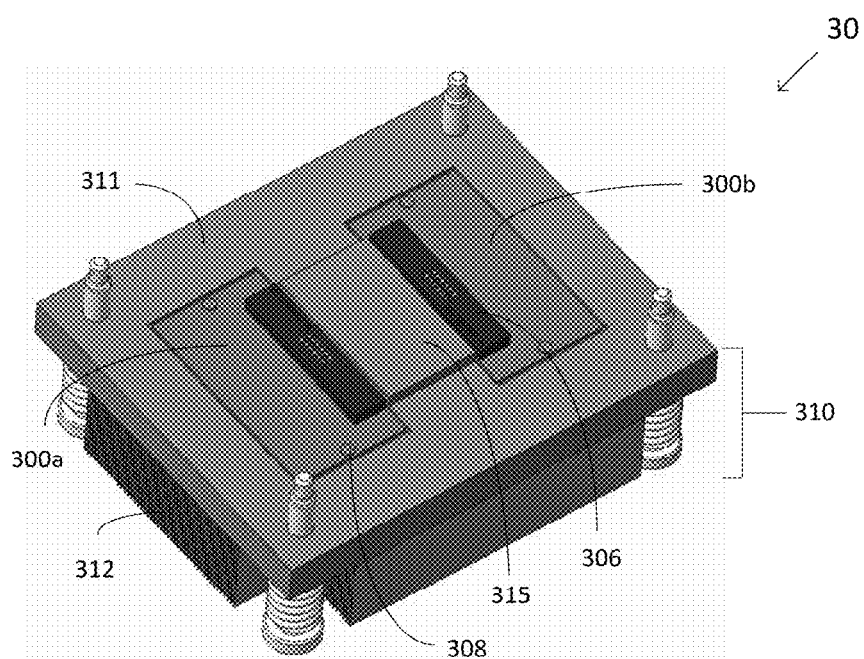
FIG. 3 shows a perspective top view layout of an integrated voltage regulator assembly including a heat sink with a metal plate having recesses with VRMBs positioned therein according to an aspect of the present disclosure.

FIG. 3 shows a perspective top view of an integrated voltage regulator assembly 30. In this aspect, the integrated voltage regulator assembly 30 may have a heat sink 310 with a metal plate 311 and heat spreader 312, with two VRMBs 300a and 300b attached to the metal plate 311 by fasteners 308. In an aspect, connectors 306 may be adjacent to the raised section 315 of the metal plate 311. This top view shows the surface of an integrated voltage regulator assembly facing a semiconductor package for thermal and electrical coupling according to the present disclosure. In some aspects, there may be up to four VRMBs attached to a heat sink.

Figure 4A:
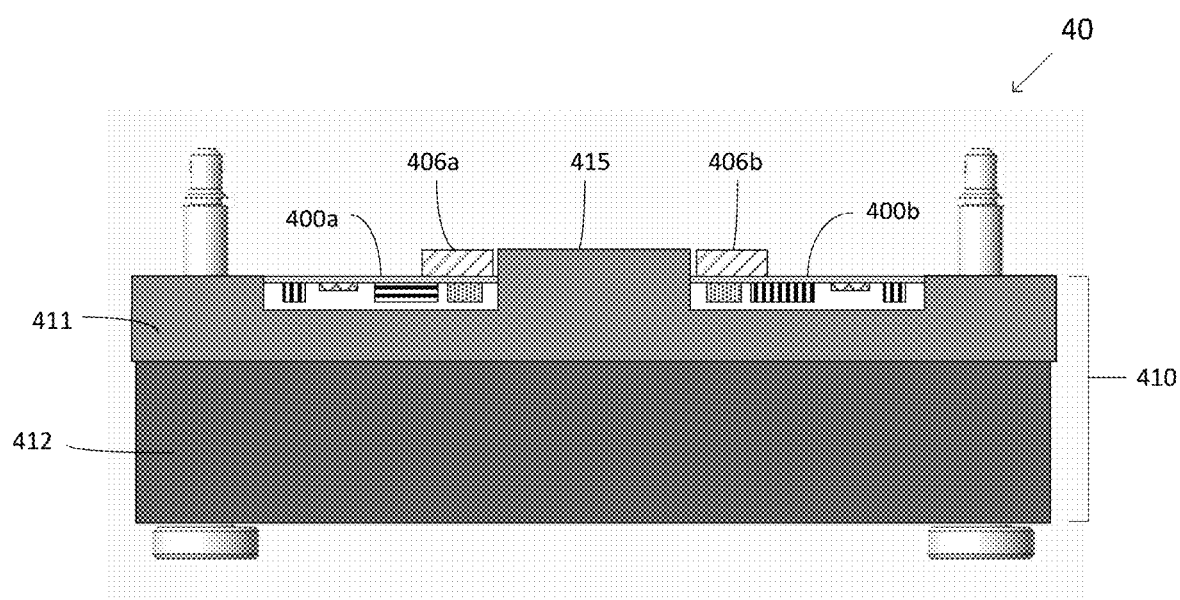
FIG. 4A shows a cross-section view of an integrated voltage regulator assembly including a heat sink with a metal plate having recesses with VRMBs positioned therein according to another aspect of the present disclosure.
Figure 4B:
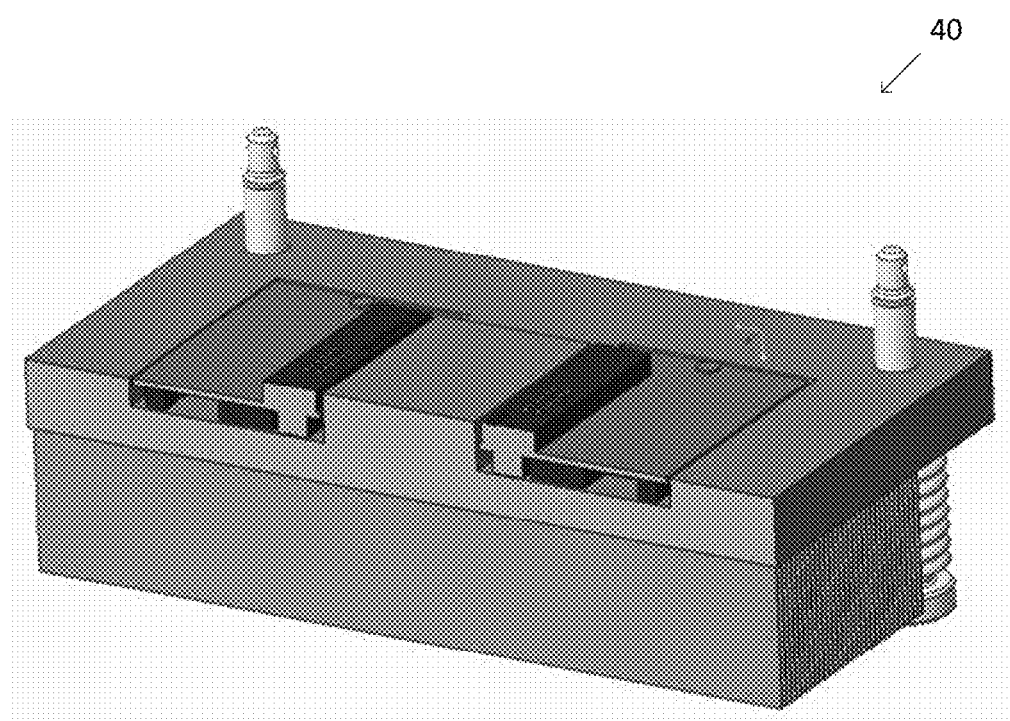
FIG. 4B shows a perspective cross-section view of the integrated voltage regulator assembly according to the aspect of FIG. 4A.

FIG. 4A shows a show a cross-section view of an integrated voltage regulator assembly 40 including a heat sink 410 with a metal plate 411 having two recesses with VRMBs 400a and 400b positioned therein according to an aspect of the present disclosure, and a heat spreader 412. In this aspect, connectors 406a and 406b may be substantially level with raised section 415. In FIG. 4B, a perspective cross-section view of the integrated voltage regulator assembly 40 is provided according to the aspect of FIG. 4A.

Figure 5A:
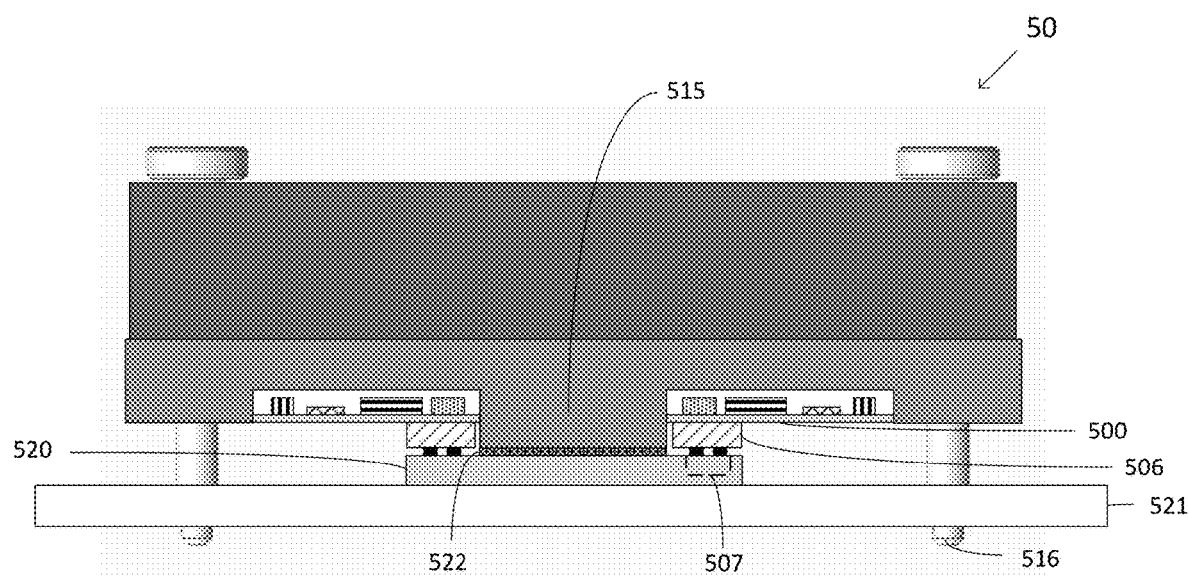
FIG. 5A shows a cross-section view of an integrated voltage regulator assembly including a heat sink with a metal plate having recesses with VRMBs positioned therein coupled to a SOC/CPU package according to an aspect of the present disclosure.

According to the present disclosure, in an aspect shown in FIG. 5A, a cross-section view of an integrated voltage regulator assembly 50, including a VRMB 500, positioned therein coupled to a semiconductor package 520 housing a SOC or CPU according to an aspect of the present disclosure. The integrated voltage regulator assembly 50 may be attached to a printed circuit board or PCB 521 using mounting pins 516. In an aspect, the SOC package 520 may be coupled to the PCB 521 using solder bumps (not shown) coupled to the VRMB 500 through a connector 506 with VRBM contact pads 507.

In an aspect shown in FIG. 5A, a raised section 515 of a heat sink may serve as a thermally conductive pathway for the attached SOC package 520, which may be attached using, for example, a thermal paste or solder. In a further aspect, the SOC package may have an integrated heat spreader 522 that may be directly attached to a SOC die (not shown).

With the placement of the VRMB 500 in a thermal heat sink positioned right above SOC package 520, the length of the traces required to deliver the power into the SOC package is shortened. Hence, there may be a reduction in the path resistance and improvement in the performance.

Figure 5B:
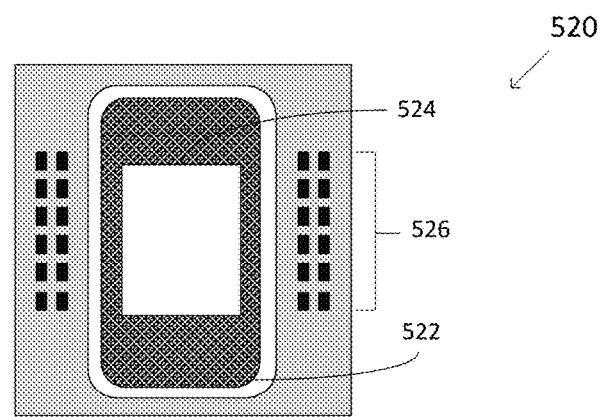
FIG. 5B shows a top view layout view of the SOC/CPU package according to according to the aspect of FIG. 5A.

FIG. 5B shows a top view layout view of the SOC package 520 according to an aspect of the present disclosure. The SOC package 520 may include the integrated heat spreader 522 that may be directly attached to a SOC die 524.

In another aspect, the SOC package 520 may include input-output pads 526, which are aligned and coupled with the VRMB contact pads 507.

In an aspect, the integrated heat spreader 522 may be embedded inside the package, while exposing its top surface for attachment to a heat sink. The integrated heat spreader 522 may be made of any suitable thermally conductive material, such as copper, aluminum, or silicon.

In the present disclosure, a method is provided including providing a voltage to at least one voltage regulator module, in which the voltage regular module is positioned on a heat sink and near a processor package, and dynamically regulating the voltage using the voltage regulator module, and directing the voltage to a processor through a top surface of the processor package, in which the path resistance is reduced.

Figure 6:
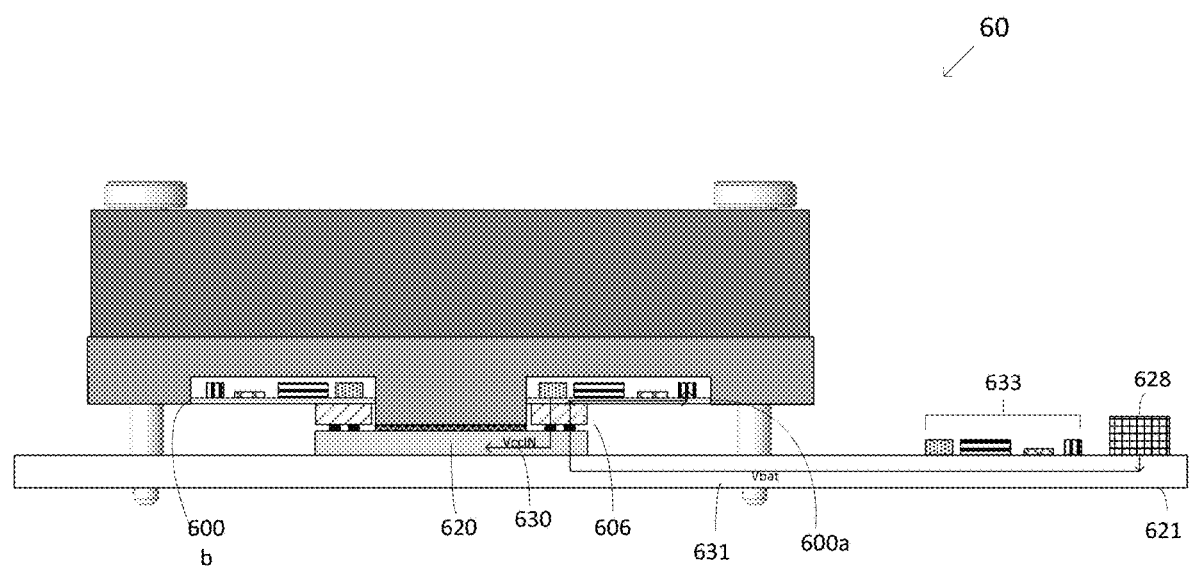
FIG. 6 shows a cross-section view of an integrated voltage regulator assembly including a heat sink with a metal plate having recesses with VRMBs positioned therein coupled to SOC/CPU package on a printed circuit board with a remote voltage regulator module according to another aspect of the present disclosure.

In FIG. 6, a cross-section view of an integrated voltage regulator assembly 60, including two VRMBs 600a and 600b positioned therein, coupled to SOC package 620 (or CPU package) that is mounted on a printed circuit board/motherboard 621 with a remote voltage regulator module 633, according to another aspect of the present disclosure. In an aspect, the input voltage for the printed circuit board will be provided by a power supply unit (not shown) routed to a battery charge unit 628. From the battery charge unit 628, the voltage power travels along a representative trace line 631 (labeled Vbat) to the SOC package 602. It is understood that a Vbat power supply has its source from a backup power supply (such as a battery) and/or a system power supply unit (PSU); for example, ATX (Advanced Technology eXtended), CRPS (Common Redundant Power Supplies) and EPS (Entry-level Power Supply) power supplies.

According to the present disclosure, both a VR module on a VRMB attached to a heat sink and a voltage regulator module coupled to a PCB may be powered (Vbat) from a battery supply or PSU. The Vbat may be routed to the SOC package through solder balls and a connector 606 to voltage regulator module.

The input voltage is routed through VRMB contact pads 607 to one or more voltage regulator module on VRMB 600a and 600b on integrated voltage regulator assembly 60 and back to SOC die via voltage input trace line 630 (labeled VcinIN) to supply power to SOC package via pads at the top of the SOC package.

In an aspect, as compared with a voltage regulator module on VRMB 600a, the typical routing distance to the SOC package is about ⅕ of the voltage regulator module 633 on the PCB/motherboard 621 and having an approximate path resistance (Rpath) ratio of 1:4.

Figure 7:
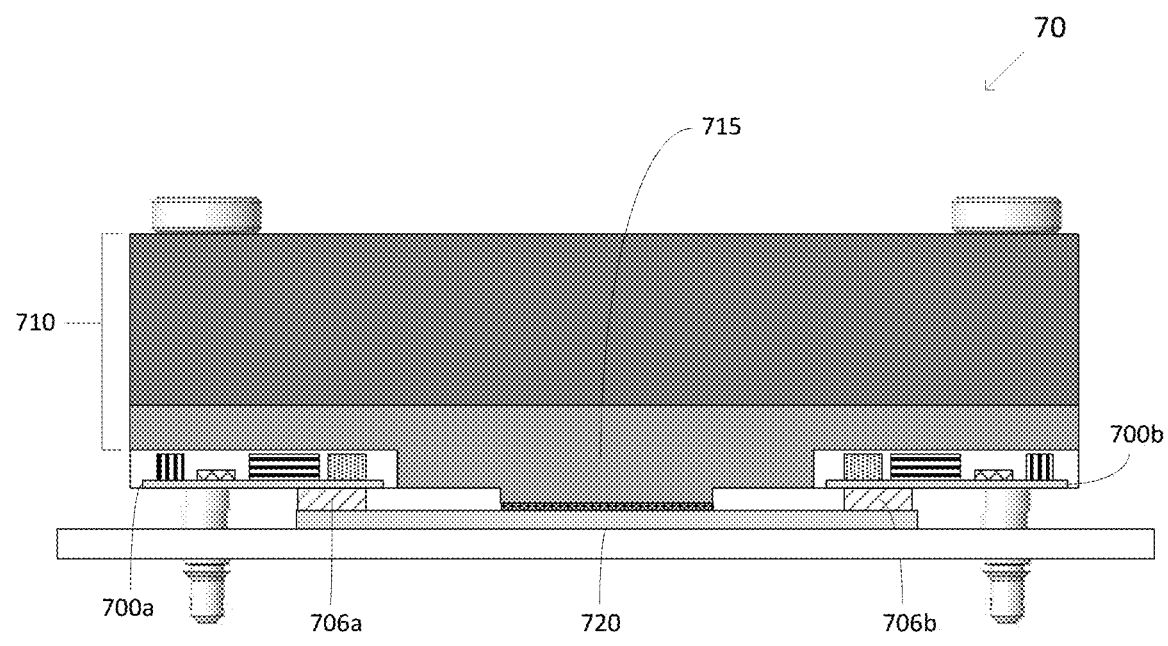
FIG. 7 shows a cross-section view of an integrated voltage regulator assembly including a heat sink with a metal plate having recesses with VRMBs positioned therein coupled to SOC/CPU package according to another aspect of the present disclosure.

In another aspect shown in FIG. 7, a cross-section view of an integrated voltage regulator assembly 70 has two VRMBs 700a and 700b positioned at the edges of the heat sink 710. An elongated SOC package 720 can couple with the connectors 706a and 706b according to another aspect of the present disclosure. This aspect provides a larger raised section 715 to provide great heat removal from the SOC package 720.

Figure 8A:
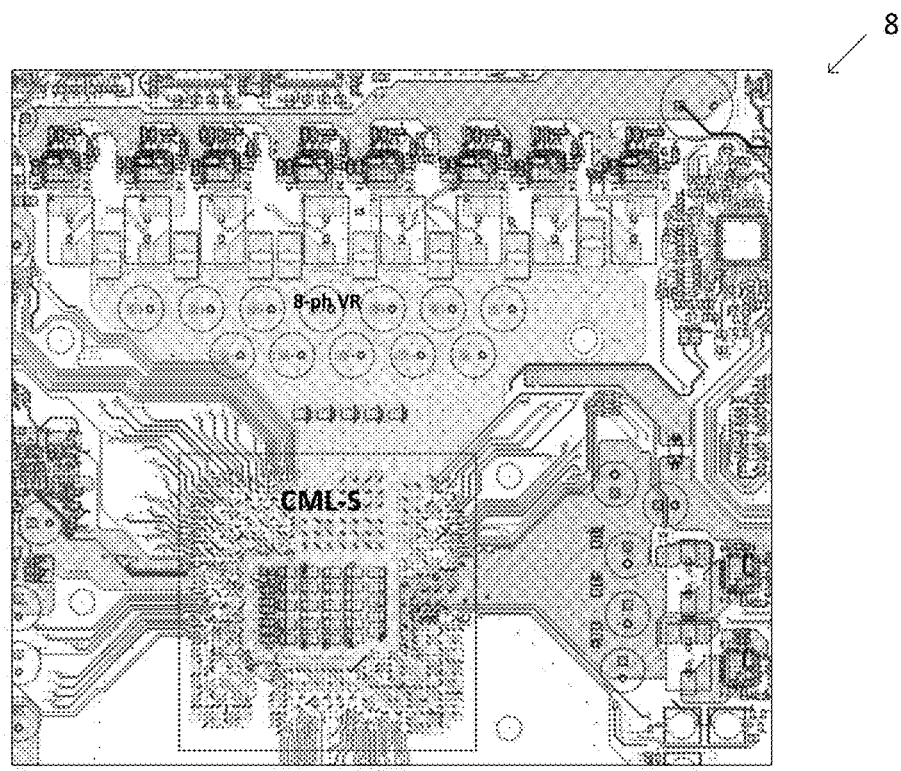
FIG. 8A shows a representative computer-aided design (CAD) layout of a standard printed circuit board with voltage regulator modules.

FIG. 8A shows a representative computer-aided design (CAD) layout of a standard printed circuit board 8 having 8 voltage regulator modules positioned on a top section of the board. In this layout, the voltage regulator modules use a significant amount of board space and it is difficult to achieve further miniaturization.

Figure 8B:
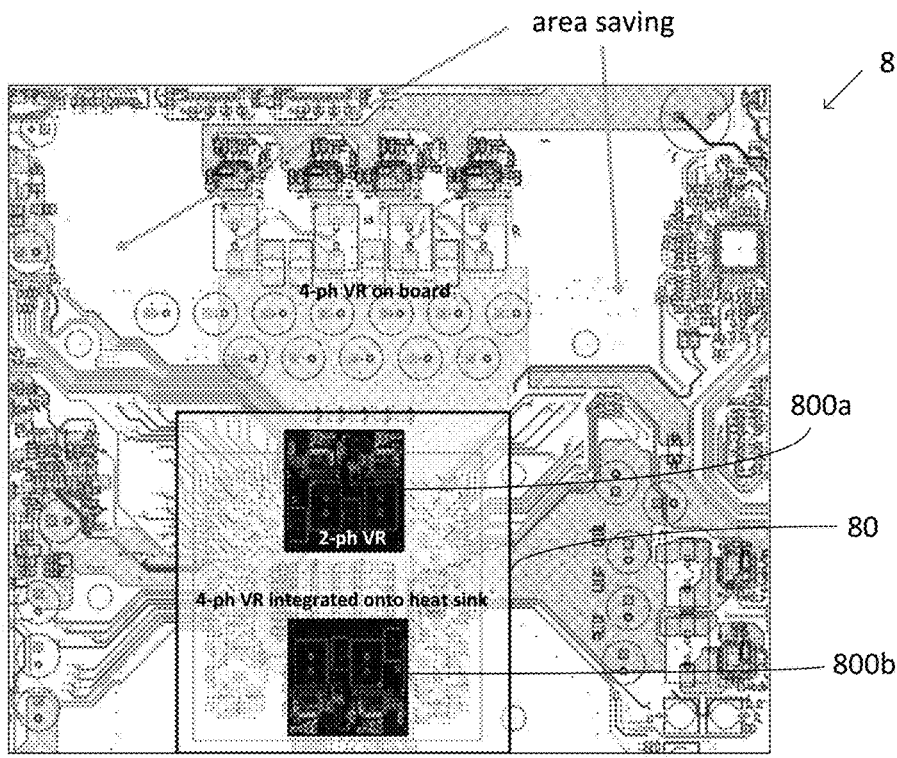
FIG. 8B shows the CAD layout of FIG. 8A modified with an integrated voltage regulator assembly according to an aspect of the present disclosure.

In contrast, in FIG. 8B, the CAD layout of FIG. 8A is modified with an integrated voltage regulator assembly 80 according to an aspect of the present disclosure. The printed circuit board 8 includes the integrated voltage regulator assembly 80 with two VRMBs 800a and 800b, each having two voltage regulator module. The area on the board that is "saved" may permit smaller board designs by moving a partial VR solution onto a heat sink and an accompanying bill of material cost savings.

Aspects of the present disclosure may be implemented in high-performance computing devices and systems, for example, workstations and servers, with any suitable hardware and/or software. As shown in the exemplary aspects, the integrated voltage regulator assembly physically and electrically coupled to a PCB/motherboard and used for a variety of computing devices using a higher power processor.

In various implementations, the computing devices may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device may be a mobile computing device. In further implementations, the computing device may be any other electronic device that processes data.

To more readily understand and put into practical effect the integrated voltage regulator assembly, particular aspects will now be described by way of examples and not limitations, and with reference to the figures. For the sake of brevity, duplicate descriptions of features and properties may be omitted.

EXAMPLES

Example 1 may include an assembly having a heat sink having at least one recess; and a voltage regulator module board in the recess.

Example 2 may include the device of example 1 and/or any other example disclosed herein in which the voltage regulator module board further includes a voltage regulator board, at least one voltage regulator module coupled to the voltage regulator board, and a connector coupled to the VR board.

Example 3 may include the device of example 2 and/or any other example disclosed herein in which the voltage regulator module further includes at least one input capacitor, at least one MOSFET device, at least one inductor, and at least one output capacitor.

Example 4 may include the device of example 2 and/or any other example disclosed herein in which the connector further includes an upper surface having input-output contact pads.

Example 5 may include the device of example 2 and/or any other example disclosed herein in which the voltage regulator board further includes a first surface and an opposing second surface, in which the voltage regulator module is coupled to the first surface and the connector is coupled to the second surface.

Example 6 may include the device of example 1 and/or any other example disclosed herein in which the heat sink further includes a metal plate and a heat spreader.

Example 7 may include the device of example 6 and/or any other example disclosed herein in which the heat sink recess is positioned off-center in the metal plate of the heat sink.

Example 8 may include the device of example 1 and/or any other example disclosed herein in which the heat sink recess is sized to accommodate the voltage regulator module board.

Example 9 may include the device of example 4 and/or any other example disclosed herein in which the heat sink further includes a raised section.

Example 10 may include the device of example 9 and/or any other example disclosed herein in which the raised section of the heat sink further includes a top surface that is co-planar with the upper surface of the connector.

Example 11 may include the device of example 10 and/or any other example disclosed herein in which the connector is positioned adjacent to the raised section.

Example 12 may include a method including providing a voltage to at least one voltage regulator module, in which the voltage regular module is positioned on a heat sink and near a processor package, and dynamically regulating the voltage using the voltage regulator module, and directing the voltage to a processor through a top surface of the processor package, in which the path resistance is reduced.

Example 13 may include the method of example 12 and/or any other example disclosed herein in which dynamically regulating the voltage using the voltage regulator module further includes providing an additional voltage through at least one remote voltage regulator module.

Example 14 may include a system having a printed circuit board, a semiconductor package coupled to the printed circuit board, a heat sink attached to the semiconductor package, at least one recess formed in a surface of the heat sink facing the semiconductor package, and a voltage regulator module board in the recess, in which the voltage regulator module board is coupled to the semiconductor package.

Example 15 may include the system of example 14 and/or any other example disclosed herein, in which the semiconductor package further includes a substrate, a processor coupled to the substrate, and input-output contact pads positioned on the substrate coupled to the processor, in which the semiconductor package is coupled to the voltage regulator module board via the input-output pads.

Example 16 may include the system of example 14 and/or any other example disclosed herein, in which the voltage regulator module board further includes a voltage regulator board, at least one voltage regulator module coupled to the voltage regulator board, and a connector coupled to the voltage regulator board.

Example 17 may include the system of example 16 and/or any other example disclosed herein, in which the voltage regulator module further includes at least one input capacitor, at least one DrMOSFET or DrGAN device, at least one inductor, and at least one output capacitor.

Example 18 may include the system of example 16 and/or any other example disclosed herein, in which the connector further includes input-output contact pads, in which the voltage regulator module board is coupled to the semiconductor package via the input-output pads.

Example 19 may include the system of example 16 and/or any other example disclosed herein, further including at least one remote voltage regulator module coupled to the printed circuit board.

Example 20 may include the system of example 16 and/or any other example disclosed herein, further including the printed circuit board being coupled to a computer workstation or a computer server.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An assembly comprising:
    a heat sink comprising a metal plate and a heat spreader, wherein the metal plate has a first surface, and a second surface opposite the first surface, and wherein the heat spreader is mounted to the second surface;
        wherein the metal plate further comprises a third surface, parallel to the first surface, and raised relative to the first surface, such that a distance between the third surface and the second surface is greater than a distance between the first surface and the second surface;
        wherein the first surface comprises a recess, such that a distance between a bottom of the recess and the second surface is less than the distance between the first surface and the second surface; and
        a voltage regulator module board mounted in the recess;
        further comprising a connector, comprising a fourth surface and a fifth surface opposite the fourth surface, wherein the fourth surface is coupled to the voltage regulator module board, and wherein the fifth surface is coplanar with the third surface;
        wherein the third surface is configured to be mounted to a semiconductor device and to form a thermally conductive pathway between the semiconductor device and the heat spreader.

2. The assembly of claim 1, wherein the voltage regulator module board further comprises
    a voltage regulator (VR) board;
    at least one voltage regulator module coupled to the voltage regulator board; and
    a connector coupled to the VR board.

3. The assembly of claim 2, wherein the voltage regulator module further comprises:
    at least one input capacitor;
    at least one MOSFET device;
    at least one inductor; and
    at least one output capacitor.

4. The assembly of claim 2, wherein the connector further comprises an upper surface having input-output contact pads.

5. The assembly of claim 1, wherein the first surface is sized to accommodate the voltage regulator module board.

6. The assembly of claim 3, wherein the raised third surface of the metal plate further comprises a top surface that is co-planar with the upper surface of the connector.

7. The assembly of claim 6, wherein the connector is positioned adjacent to the raised section.

8. The assembly of claim 1, wherein the third surface is positioned along a middle of the first surface.

9. A system comprising:
   a printed circuit board;
   a semiconductor package coupled to the printed circuit board;
   a heat sink attached to the semiconductor package, wherein the heat sink comprises a metal plate and a heat spreader, wherein the metal plate has a first surface, and a second surface opposite the first surface, and wherein the heat spreader is mounted to the second surface;
   wherein the metal plate further comprises a third surface, parallel to the first surface, and raised relative to the first surface, such that a distance between the third surface and the second surface is greater than a distance between the first surface and the second surface;
   wherein the first surface comprises a recess, such that a distance between a bottom of the recess and the second surface is less than the distance between the first surface and the second surface;
   a voltage regulator module board in the recess, wherein the voltage regulator module board is coupled to the semiconductor package.

10. The system of claim 9, wherein the semiconductor package further comprises:
    a substrate;
    a processor coupled to the substrate; and
    input-output contact pads positioned on the substrate coupled to the processor, wherein the semiconductor package is coupled to the voltage regulator module board via the input-output pads.

11. The system of claim 9, wherein the voltage regulator module board further comprises:
    a voltage regulator board;
    at least one voltage regulator module coupled to the voltage regulator board; and
    a connector coupled to the voltage regulator board.

12. The system of claim 11, wherein the voltage regulator module further comprises:
    at least one input capacitor;
    at least one DrMOSFET or DrGAN device;
    at least one inductor; and
    at least one output capacitor.

13. The system of claim 11, wherein the connector further comprises input-output contact pads, wherein the voltage regulator module board is coupled to the semiconductor package via the input-output pads.

14. The system of claim 11, further comprising at least one remote voltage regulator module coupled to the printed circuit board.

15. The system of claim 11, further comprising the printed circuit board being coupled to a computer workstation or a computer server.

* * * * *